United States Patent [19]

Grupen-Shemansky

[11] Patent Number: 5,268,065
[45] Date of Patent: Dec. 7, 1993

[54] METHOD FOR THINNING A SEMICONDUCTOR WAFER

[75] Inventor: Melissa E. Grupen-Shemansky, Phoenix, Ariz.

[73] Assignee: Motorola, Inc., Schaumburg, Ill.

[21] Appl. No.: 993,984

[22] Filed: Dec. 21, 1992

[51] Int. Cl.$^5$ .................. H01L 21/306; B44C 1/22
[52] U.S. Cl. .................. 156/630; 156/631; 156/633; 156/645; 156/657; 156/662
[58] Field of Search .............. 156/630, 631, 633, 636, 156/645, 655, 657, 662

[56] References Cited

U.S. PATENT DOCUMENTS

| | | | |
|---|---|---|---|
| 3,475,867 | 11/1969 | Walsh | 51/277 |
| 3,492,763 | 2/1970 | Walsh | 51/281 |
| 3,960,623 | 6/1976 | Gantley | 156/631 |
| 4,310,583 | 1/1982 | Baker et al. | 156/630 X |
| 4,700,467 | 10/1987 | Donzelli | 156/631 X |
| 4,846,931 | 7/1989 | Gmitter et al. | 156/633 |
| 4,983,251 | 1/1991 | Haisma et al. | 156/630 |
| 4,994,139 | 2/1991 | Biermann et al. | 156/636 X |
| 5,127,984 | 7/1992 | Hua et al. | 156/630 |

OTHER PUBLICATIONS

"Mass Production Back-Grinding/Wafer-Thinning Technology for GaAs Devices", IEEE Transaction on Components, Hybrids, and Manufacturing Technology, vol. 13, No. 3, Sep. 1990.

*Primary Examiner*—William A. Powell
*Attorney, Agent, or Firm*—Joe E. Barbee; Rennie William Dover

[57] ABSTRACT

A method for thinning a semiconductor wafer (11) is provided. An support film (15) is mounted to the semiconductor wafer (11). The support film (15) provides support for a semiconductor wafer during thinning as well as protection for a front-side (12) of the semiconductor wafer (11). After mounting the support film (15) to the semiconductor wafer (11), a back-side (13) of the semiconductor wafer is etched in a two step process. First the back-side (13) undergoes a mechanical grinding followed by a chemical etch. A metal film (18) may be sputtered on the back-side (13). The semiconductor wafer (11) having the support film (15) is placed in a tape frame (20) for dicing operations and the support film (15) is removed from the front-side (12) of the semiconductor wafer (11).

20 Claims, 2 Drawing Sheets

METHOD FOR THINNING A SEMICONDUCTOR WAFER

BACKGROUND OF THE INVENTION

This invention relates, in general, to methods of processing a semiconductor wafer, and more particularly to methods of thinning a semiconductor wafer.

Semiconductor wafer thinning techniques have been developed in response to the ever increasing demand for smaller, higher performance semiconductor devices. For example, semiconductor devices operated at high speeds generate large amounts of heat. This heat must be removed from the semiconductor device to prevent device failure due to heat stress and to prevent degradation of the frequency response due to a decrease in carrier mobility. One way to enhance thermal transfer away from the semiconductor device, thereby mitigating any deleterious temperature effects, is by thinning the semiconductor wafer in which the device is fabricated. Other reasons for thinning a semiconductor wafer include dimensional packaging constraints, optimization of transmission line characteristics, and formation of via holes.

Typically, semiconductor devices are thinned while the devices are in wafer form. A consequence of thinning a semiconductor wafer is to increase its fragility. Thus, a semiconductor wafer is generally mounted to a submount prior to thinning, wherein the submount provides structural support as well as protection for the wafer surface. A first step in mounting a semiconductor wafer to the submount is coating a major surface of the wafer with an adhesive material. The adhesive coated major surface is bonded to the submount, thereby forming a bonded wafer. In addition to providing structural support for the semiconductor wafer the submount may serve as a handle. An example of a technique for applying an adhesive material to a semiconductor wafer and mounting the semiconductor wafer to a submount may be found in U.S. Pat. No. 3,475,867 entitled "Processing of Semiconductor Wafers," and in U.S. Pat. No. 3,492,763 entitled "Method and Apparatus for Mounting Semiconductor Slices," respectively.

The bonded wafer is thinned by either mechanically grinding or chemically etching an exposed surface of the semiconductor wafer. The adhesive material bonding the semiconductor wafer to the submount must provide a bond capable of withstanding the shearing forces generated by mechanical grinding, the reactivity of a chemical etchant, and temperatures associated with semiconductor wafer processing.

Although methods for thinning semiconductor wafers are known, they are not without limitations. For example, the step of mounting a semiconductor wafer to a submount requires expensive coating and bonding equipment and increases the overall processing time for manufacturing a semiconductor device, i.e. increases the cycle time. Further, the use of liquid adhesive materials increases the potential for introducing contaminants into the process area. In addition, the processing temperatures which the bonded wafer encounters must remain below the melting temperature of the adhesive material. Other limitations include the warping or bowing of semiconductor wafers due to mismatches between the coefficients of thermal expansion of the wafer and the submount, complications in automatic wafer handling due to the thickness of the bonded wafer, and having an unsupported wafer upon separation of the wafer and the submount.

Accordingly, it would be advantageous to have a method for thinning a semiconductor wafer having an optimized number of processing steps and which is compatible with automated wafer handling systems. The method should decrease the cycle time required for processing a semiconductor wafer and be capable of employing either mechanical grinding, chemical etching, or a combination of the two. Further, it is desirable that the method provide a handle to eliminate any unsupported wafer handling that may occur after the wafer has been thinned and that the handle continue to provide support at temperatures used for sputter deposition of metals.

SUMMARY OF THE INVENTION

Briefly stated, the present invention is a method for thinning a semiconductor wafer. A semiconductor wafer having a first major surface and a second major surface is provided. A support film having a first major surface which has an adhesive strength of less than approximately 20 grams per 25 millimeters of support film width at a 90 degree pulling angle is provided. The support film is capable of withstanding temperatures up to approximately 200 degrees Celsius. The first major surface of the support film is bonded with the first major surface of the semiconductor wafer. A desired thickness of the semiconductor wafer is removed from the second major surface. Subsequently, the support film is separated from the semiconductor wafer.

DETAILED DESCRIPTION OF THE DRAWINGS

Figure 1:
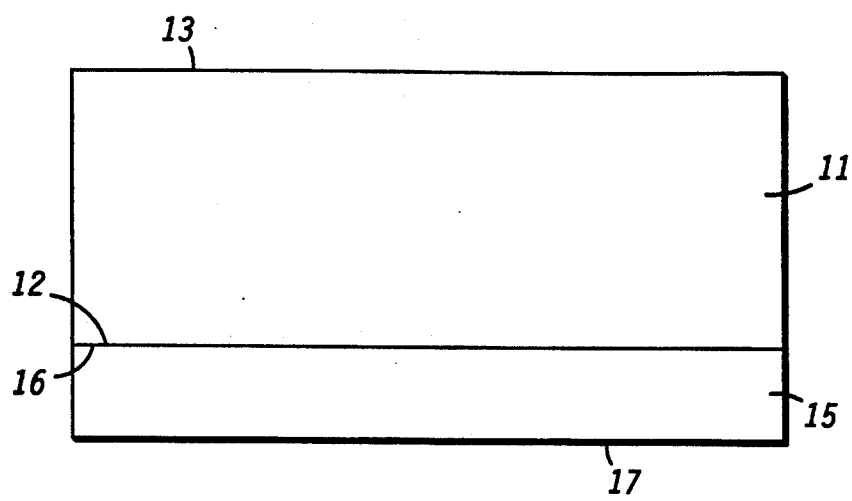
FIG. 1 illustrates a highly enlarged cross-sectional view of a semiconductor wafer to which a support film is bonded in accordance with the present invention.

A substrate 11 such as a semiconductor wafer (shown in FIG. 1) having a major surface 12 and a major surface 13 is provided. Semiconductor devices are fabricated on major surface 12 which is hereby defined herein as a front-side of semiconductor wafer 11. Major surface 13, commonly referred to as a back-side, is a portion that will be removed by mechanical grinding or chemical etching. Preferably, semiconductor wafer 11 is a gallium arsenide semiconductor wafer having a thickness of approximately 625 micrometers (approximately 24.6 mils). It shall be understood that the type of semiconductor material for semiconductor wafer 11 and its initial thickness are not limitations of the present invention. For example, semiconductor wafer 11 may be silicon, silicon germanium, indium phosphide, or the like.

In addition, a support film 15 (shown in FIG. 1) having a major surface 16 and a major surface 17 is provided. Support film 15 is also referred to as a handle, a film, or a tape. Preferably, major surface 16 comprises a low-tack contact material capable of adhering to smooth surfaces. A smooth surface in the context of the present invention includes semiconductor wafers comprising semiconductor materials such as those mentioned previously, wherein one side of each semiconductor wafer has been processed to have semiconductor devices therein. A suitable support film 15 is a tape having a part number WF-55-X4-HT sold as a Gel-Pak ™ product line herein referred to as the support film. Gel-Pak ™ is a trademark of the Chip Carrier Shipping System Division of Vichem Corporation. The Chip Carrier Shipping System Division of Vichem Corporation is located at 756 North Pastoria Avenue, Sunnyvale, Calif. 94086. The tape or support film comprises a polyester layer having a thickness of approximately 127 $\mu$m (approximately 5 mils), a contact layer comprising a resilient silicone rubber having a thickness of approximately 153 $\mu$m (approximately 6 mils) and an interlayer therebetween comprising aluminum having a thickness of less than approximately 0.01 $\mu$m (approximately 100 angstroms). The aluminum interlayer provides additional stiffness, uniform temperature distribution, electrostatic discharge protection, and promotes adhesion between the polyester layer and the silicone rubber layer. Although support film 15 having part number WF-55-X4-HT is preferred and has an aluminum interlayer, it shall be understood that the aluminum interlayer is optional.

Typically, tapes are not used to provide support because they have an unacceptably high adhesive strength, degrade at temperatures used, for example, in metal sputter deposition processes, and provide a compressive stress to thinned semiconductor wafers such that they tend to bow or break the thinned semiconductor wafers. The Gel-Pak ™ support film 15, however, is a heat stable film capable of withstanding temperatures up to approximately 200 degrees Celsius (°C.). The ability of support film 15 to withstand temperatures up to approximately 200° C. enables its use in subsequent high temperature wafer processing steps such as back metal sputter deposition. Further, support film 15 is readily removed from, for example, a semiconductor wafer by peeling, wherein the support film has sufficient shear strength that it does not tear or separate and leave a portion on the semiconductor wafer. In addition, a thinned semiconductor wafer is not broken or otherwise damaged during the removal of the support film.

Although an adhesive strength or tackiness is not provided for the Gel-Pak ™ support film 15 it is believed to have an adhesive strength less than approximately 20 grams per 25 millimeters of film width at a 90 degree pulling angle. Thus, films encompassed by the scope of the present invention include those capable of withstanding a temperature up to approximately 200° C., having an adhesive strength less than approximately 20 grams per 25 millimeters of film width at a 90 degree pulling angle, and providing substantially zero compressive stress to a substrate such as a thinned semiconductor wafer.

FIG. 1 illustrates a highly enlarged cross-sectional view of a semiconductor wafer 11 to which support film 15 is bonded or attached in accordance with the present invention. A roll of support film 15 is placed on a peripheral portion of front-side 12 with contact surface 16 facing front-side 12. Support film 15 is rolled across front-side 12 from one edge located at the peripheral portion of semiconductor wafer 11 to an opposite edge. The act of rolling support film 15 across front-side 12 bonds or attaches to contact surface 16 and front-side 12 together without voids, thereby forming a mounted wafer 10. To facilitate bonding of support film 15 to semiconductor wafer 11, semiconductor wafer 11 may be placed on a vacuum chuck wherein the vacuum is enabled. It shall be understood that the method for bonding support film 15 to semiconductor wafer 11 is not a limitation of the present invention. In other words, support film 15 may be applied by hand or using a low-tension tape distribution apparatus. However, it is desirable that support film 15 not have any wrinkles. Further, the bonding of contact surface 16 and front-side 12 provides a substantially zero stress bond that does not significantly bow or warp semiconductor wafer 11 in its thinned state. If a vacuum chuck is used, the vacuum is disabled allowing removal of mounted wafer 10 from the vacuum chuck.

Support film 15 provides support for semiconductor wafer 11 as well as covering front side 12, and providing protection for front-side 12 during the wafer thinning steps. Thus, support film 15 serves as a handle for subsequent wafer processing steps. A variety of methods for thinning semiconductor wafer 11 are available including mechanical grinding, lapping, chemical etching, and a combination mechanical grinding/chemical etching or lapping/chemical etching. It shall be understood that the step of thinning includes removing a desired thickness from semiconductor wafer 11 wherein the desired thickness is removed from back-side 13. Since mechanical grinding introduces a grinder induced stress, it is preferable that a combination of mechanical grinding and a chemical etching be performed to accomplish wafer thinning in accordance with the present invention. In a first example, semiconductor wafer 11, comprising gallium arsenide and having a thickness of approximately 625 $\mu$m, is thinned by mechanical grinding to a thickness of approximately 400 $\mu$m (approximately 16 mils). Thus a desired thickness of approximately 225 $\mu$m is removed from back-side 13. It shall be understood that although semiconductor wafer 11 is thinned to a thickness of approximately 400 $\mu$m, mechanical grinding can be used to grind semiconductor wafer 11 to a thickness of approximately 250 $\mu$m. At thicknesses less than approximately 250 $\mu$m, a gallium arsenide semiconductor wafer becomes extremely fragile. An advantage of mechanical grinding is that this technique is a fast and accurate way to thin a semiconductor wafer. Thus, fragility of the gallium arsenide semiconductor wafer places a constraint to which a gallium arsenide semiconductor wafer can be thinned using a mechanical grinding technique. A semiconductor wafer 11 comprising silicon, on the other hand, may be mechanically thinned to approximately 50 $\mu$m before becoming susceptible to breakage due to its fragility.

Methods for grinding wafers are well known in the art. A mechanical grinding method suitable for use in the present invention is described by Hishiguchi et al in their article "Mass Production Back-Grinding/Wafer-Thinning Technology for GaAs Devices" published in the IEEE Transaction on Components, Hybrids, and Manufacturing Technology, Vol 13, No. 3, Sep. 1990.

Figure 2:
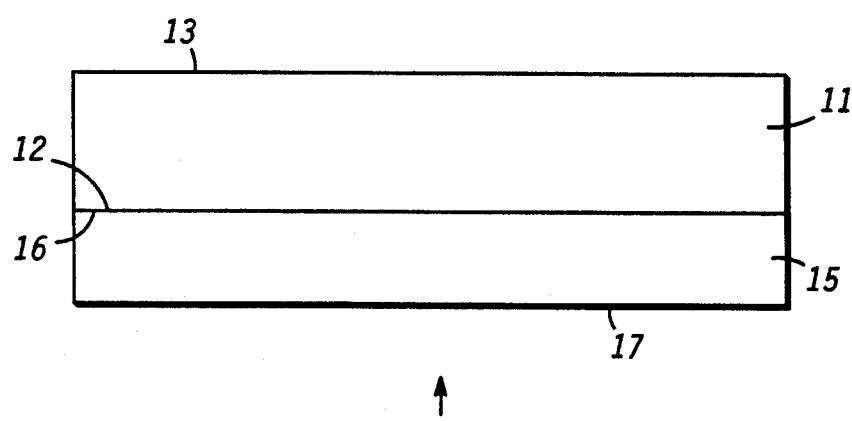
FIG. 2 illustrates a highly enlarged cross-sectional view of the semiconductor wafer and support film of FIG. 1 after a mechanical thinning step in accordance with the present invention.

FIG. 2 illustrates a highly enlarged cross-sectional view of semiconductor wafer 11 and support film 15 of FIG. 1 after the step of mechanically grinding back-side 13.

To relieve grinder induced stress and to further thin semiconductor wafer 11, back-side 13 is subjected to chemical etching. Preferably, the chemical etching is performed in a single sided spray spin etcher such as, for example, an APT model 9165. An advantage in using a single sided spray spin etcher like the APT model 9165 is that it has a plurality of dispense ports which are microprocessor controlled thereby permitting a plurality of chemical etching steps without removing the mounted wafer 10 from the system. In a first step, mounted wafer 10 is placed in the spray spin etcher. The spray spin etcher is enabled and an etchant comprising a mixture of sulfuric acid, hydrogen peroxide, and water is dispensed from a first dispense port to back-side 13. Preferably, semiconductor wafer 11 is etched to a thickness ranging between approximately 50 and 360 µm (approximately 2 and 14 mils, respectively) using a chemical etchant such as the one described. The composition of the chemical etchant is not a limitation of the present invention. The etching of semiconductor wafer 11 is terminated by stopping the flow of etchant from the first dispense port and starting the flow of a cleaning solution comprising, for example, ammonium hydroxide and water from a second dispense port. It shall be understood that a thickness to which semiconductor wafer 11 is thinned or etched is not a limitation of the present invention.

Figure 3:
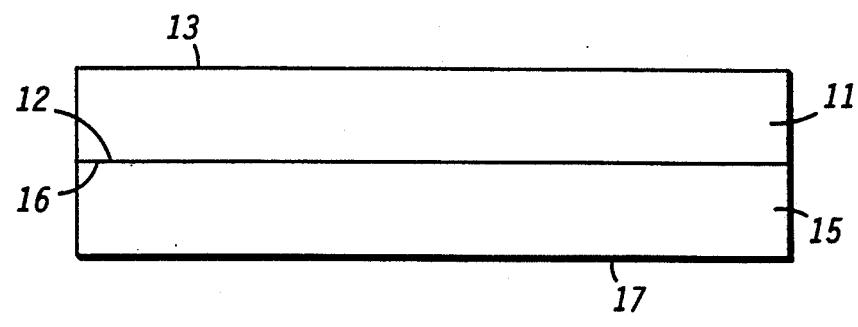
FIG. 3 illustrates a highly enlarged cross-sectional view of the semiconductor wafer and support film of FIG. 2 after a chemical thinning step in accordance with the present invention.

The cleaning step is followed by a rinse with deionized water. The de-ionized water is dispensed from a third dispense port. Semiconductor wafer 11 is dried using, for example, nitrogen. FIG. 3 illustrates a highly enlarged cross-sectional view of mounted wafer 10 after the step of chemically etching.

It shall be understood that the step of chemically etching using a spray spin etcher is not limited to a single sided spray spin etcher or to an APT model 9165. In other words a batch Semitool spray etcher, or spray spin etching using models other than the APT model 9165 may be used to accomplish the step of chemical etching.

In a second example, semiconductor wafer 11 is thinned using the mechanical grinding technique of the first example followed by chemical etching. However, in this example the chemical etching is performed in an etch bath rather than a spray spin etcher. Methods for etching semiconductor wafers in an etch bath are well known to those skilled in the art.

Figure 4:
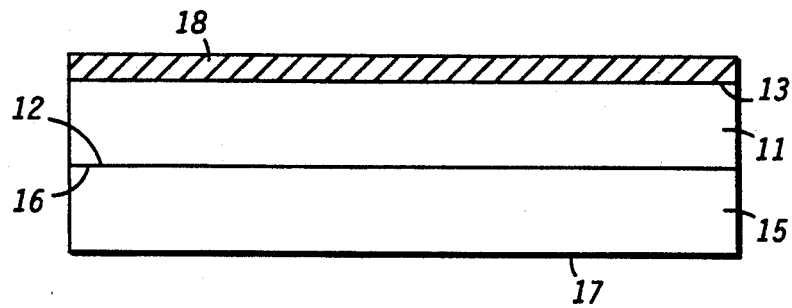
FIG. 4 illustrates a highly enlarged cross-sectional view of the semiconductor wafer and support film of FIG. 3 after metallization of a surface of the semiconductor wafer.

After drying, mounted wafer 10 is ready for subsequent processing. In one embodiment, mounted wafer 10 is placed in a back metal sputter system for sputter deposition of a metal film. FIG. 4 illustrates a highly enlarged cross-sectional view of mounted wafer 10 having a metal layer 18 sputtered onto back-side 13 of semiconductor wafer 11. Methods of sputtering layers of metal on semiconductor wafers, such as semiconductor wafer 11 are well known in the art. Metal film 18 may be, for example, a nickel-vanadium layer having a thickness of approximately 300 nanometers and a gold layer having a thickness of approximately 100 nanometers.

Figure 5:
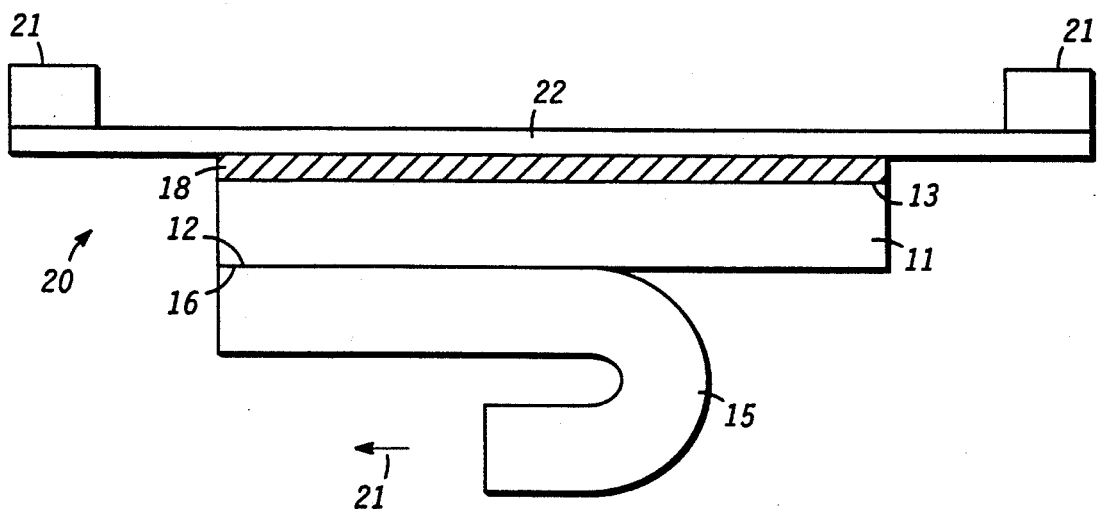
FIG. 5 illustrates a highly enlarged cross-sectional view of a thinned semiconductor wafer mounted to a tape frame and partial removal of the support film in accordance with the present invention.

FIG. 5 illustrates a highly enlarged cross-sectional view of a thinned wafer 11 having a metal film 18 mounted to a tape frame 20 and partial removal of support film 15. In one embodiment, tape frame 20 comprises a circular molded plastic ring 21 across which an adhesive tape 22 is stretched taut. Thinned wafer 11 is mounted to tape frame 20 in preparation for dicing. Tape frames and methods for mounting semiconductor wafers such as thinned wafer 11 to tape frames are well known and commonly used in wafer dicing operations. Preferably, support film 15 is separated or removed from front-side 12 after mounting to support 20. Tape frame 20 provides support to semiconductor wafer 11 after support film 15 is removed. Support film 15 may be removed by peeling the film as indicated by arrow 21 of FIG. 5. Peeling support film 15 may be accomplished manually using, for example, vacuum tweezers, or an automated process.

By now it should be appreciated that the present invention provides a method for thinning semiconductor wafers, thus increasing a thermal dissipation capability of semiconductor wafers. The method provides both structural support and front-side wafer protection throughout all the processing steps. More particularly, the support film providing these features may remain attached to the semiconductor wafer until the wafer is mounted in a tape frame, thus the semiconductor wafer is never in an unsupported state. Moreover, the support provided by the support film or handle permits cassette to cassette handling of the mounted wafer such as those used in automated wafer handling systems.

Further, the thermal properties of the support film allow the mounted wafer to undergo high temperature processing steps such as, for example, back metal sputter for thinning wafers that decreases the number of processing steps required to thin a wafer, thereby decreasing both cycle time and the monetary costs associated with wafer thinning.

I claim:
1. A method for thinning a semiconductor wafer, comprising the steps of:
   providing a semiconductor wafer having a first major surface and a second major surface;
   providing a support film capable of withstanding a temperature up to approximately 200 degrees Celsius, and having a first major surface and a second major surface, wherein the first major surface has an adhesive strength less than approximately 20 gram per 25 millimeters of support film width at a 90 degree pulling angle;
   bonding the first major surface of the support film with the first major surface of the semiconductor wafer;
   removing a desired thickness from the semiconductor wafer wherein the desired thickness is removed from a side of the semiconductor wafer having the second major surface; and
   separating the first major surface of the support film from the first major surface of the semiconductor wafer.
2. A method for thinning a semiconductor wafer as claimed in claim 1 wherein the step of removing a desired thickness from the semiconductor wafer includes mechanically grinding the second major surface of the semiconductor wafer.
3. A method for thinning a semiconductor wafer as claimed in claim 1 wherein the step of removing a desired thickness from the semiconductor wafer includes chemically etching the second major surface of the semiconductor wafer.

4. A method for thinning a semiconductor wafer as claimed in claim 1 wherein the step of removing a desired thickness from the semiconductor wafer further includes the steps of:
mechanically grinding a desired thickness of the second major surface of the semiconductor wafer; and
chemically etching the second major surface of the semiconductor wafer to a desired thickness.

5. A method for thinning a semiconductor wafer as claimed in claim 4 wherein a step of chemically etching includes applying a chemical etchant to a single side of the semiconductor wafer.

6. A method for thinning a semiconductor wafer as claimed in claim 4 wherein a step of chemically etching includes etching in an etch bath.

7. A method for thinning a semiconductor wafer as claimed in claim 1 wherein the step of bonding the first major surface of the support film with the first major surface of the semiconductor wafer includes rolling the support film onto the semiconductor wafer.

8. A method for thinning a semiconductor wafer as claimed in claim 1 wherein the step of separating the first major surface of the support film from the first major surface of the semiconductor wafer includes mounting the semiconductor wafer on a tape frame followed by peeling the support film from the first major surface of the semiconductor wafer.

9. A method for thinning a semiconductor wafer as claimed in claim 1 wherein the step of removing a desired thickness from the semiconductor wafer includes sputtering a metal film on the second major surface.

10. A method for thinning a substrate, comprising the steps of:
providing a substrate, the substrate having a first major surface and a second major surface;
providing a handle having an adhesive strength less than approximately 20 grams per 25 millimeters of handle width at a 90 degree pulling angle;
covering the first major surface with the handle;
removing a desired thickness from the substrate wherein the desired thickness is removed from a side of the substrate having the second major surface; and
removing the handle from the first major surface of the substrate.

11. A method for thinning a substrate as claimed in claim 10 wherein the step of providing a film includes providing a film capable of withstanding temperatures ranging up to, approximately, 200 degrees Celsius.

12. A method for thinning a substrate as claimed in claim 10 wherein the step of removing a desired thickness from the substrate includes the steps of:
mechanically grinding a desired thickness of the second major surface of the substrate; and
chemically etching a desired thickness of the second major surface of the substrate.

13. A method for thinning a substrate as claimed in claim 12 wherein the step of chemically etching the desired thickness includes the steps of:
etching the substrate with a first solution, the first solution comprising sulfuric acid, hydrogen peroxide, and water;
cleaning the substrate with a second solution, the second solution comprising ammonium hydroxide, and water;
rinsing the substrate with water; and
drying the substrate.

14. A method for thinning a substrate as claimed in claim 10 wherein the step of removing the handle from the first major surface of the substrate includes the steps of:
mounting the substrate on a tape frame; and
peeling the handle from the first major surface of the substrate.

15. A method for increasing a thermal dissipation capability of a semiconductor wafer, comprising the steps of:
providing a semiconductor wafer having a first major surface and a second major surface;
attaching a support film to the first major surface of the semiconductor wafer;
thinning the semiconductor wafer;
providing a metallic film on the second major surface of the semiconductor wafer; and
peeling the support film from the first major surface of the semiconductor wafer.

16. A method for increasing a thermal dissipation capability of a semiconductor wafer as claimed in claim 15 wherein the step of attaching a support film to the first major surface of the semiconductor wafer includes providing a support film, the support film capable of withstanding temperatures ranging up to, approximately, 200 degrees Celsius.

17. A method for increasing a thermal dissipation capability of a semiconductor wafer as claimed in claim 15 wherein the step of thinning the semiconductor wafer includes the steps of:
grinding the second major surface of the semiconductor wafer to a desired thickness; and
chemically etching a desired thickness of the second major surface.

18. A method for increasing a thermal dissipation capability of a semiconductor wafer as claimed in claim 15 wherein the step of peeling the support film includes mounting the support film in a tape frame followed by peeling the support film.

19. A method for increasing a thermal dissipation capability of a semiconductor wafer as claimed in claim 15 wherein the step of attaching a support film to the first major surface of the semiconductor wafer includes the steps of:
placing a portion of the first major surface of the support film on a peripheral portion of the first major surface of the semiconductor wafer; and
rolling the support film from one edge at the peripheral portion to an opposite edge of the first major surface of the semiconductor wafer, wherein the step of rolling bonds the support film to the semiconductor wafer.

20. A method for increasing a thermal dissipation capability of a semiconductor wafer as claimed in claim 15 wherein the step of providing a metallic film includes sputter depositing the metallic film.

* * * * *